(12) United States Patent
Doi et al.

(10) Patent No.: US 11,342,211 B2
(45) Date of Patent: May 24, 2022

(54) WAFER INSPECTION APPARATUS AND WAFER INSPECTION METHOD

(71) Applicant: HITACHI HIGH-TECH CORPORATION, Tokyo (JP)

(72) Inventors: Akira Doi, Tokyo (JP); Minoru Sasaki, Tokyo (JP); Masaki Hasegawa, Tokyo (JP); Hironori Ogawa, Tokyo (JP); Tomohiko Ogata, Tokyo (JP); Yuko Okada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 133 days.

(21) Appl. No.: 16/981,769

(22) PCT Filed: May 30, 2018

(86) PCT No.: PCT/JP2018/020719
§ 371 (c)(1),
(2) Date: Sep. 17, 2020

(87) PCT Pub. No.: WO2019/229871
PCT Pub. Date: Dec. 5, 2019

(65) Prior Publication Data
US 2021/0118710 A1 Apr. 22, 2021

(51) Int. Cl.
*H01L 21/67* (2006.01)
*G06T 7/64* (2017.01)
(Continued)

(52) U.S. Cl.
CPC .... *H01L 21/67288* (2013.01); *G01B 11/0608* (2013.01); *G01N 21/9505* (2013.01);
(Continued)

(58) Field of Classification Search
CPC ... H01L 21/67288; G06T 7/64; G06T 7/0004; G06T 2207/10061; G06T 2207/30148;
(Continued)

(56) References Cited

U.S. PATENT DOCUMENTS 6,831,998 B1 * 12/2004 Koshishiba ............ G06V 10/94
382/304
6,917,421 B1 * 7/2005 Wihl .................. G01B 11/0608
356/624

(Continued)

FOREIGN PATENT DOCUMENTS

| JP | 11-135056 A | 5/1999 |
| JP | 11-250847 A | 9/1999 |

(Continued)

OTHER PUBLICATIONS

International Search Report of PCT/JP2018/020719 dated Jul. 31, 2018.

*Primary Examiner* — Jefferey F Harold
*Assistant Examiner* — Timothy R Newlin
(74) *Attorney, Agent, or Firm* — Mattingly & Malur, PC

(57) ABSTRACT

The present disclosure provides a wafer inspection technology that involves less degradation of the image quality even when an object to be observed has a variation in height due to warpage, etc. of a wafer. This wafer inspection apparatus obtains an image with less degradation by: adjusting the focal point of an observation optical system to a height measured by a height sensor for measuring wafer surface heights; and further, correcting a switching signal for a CCD line sensor on the basis of stage position data and optical magnification data corresponding to the height so as to make a correction corresponding to the wafer surface height.

10 Claims, 11 Drawing Sheets

(51) Int. Cl.
  *G01B 11/06* (2006.01)
  *G01N 21/95* (2006.01)
  *G01N 23/2251* (2018.01)
  *G06T 7/00* (2017.01)
  *H04N 5/235* (2006.01)

(52) U.S. Cl.
  CPC ....... *G01N 23/2251* (2013.01); *G06T 7/0004* (2013.01); *G06T 7/64* (2017.01); *H04N 5/2352* (2013.01); *G01N 2223/07* (2013.01); *G01N 2223/20* (2013.01); *G01N 2223/507* (2013.01); *G01N 2223/6116* (2013.01); *G06T 2207/10061* (2013.01); *G06T 2207/30148* (2013.01)

(58) Field of Classification Search
  CPC ............. G01B 11/0608; G01N 1/9505; G01N 23/2251; G01N 2223/07; G01N 2223/20; G01N 2223/507; G01N 2223/6116; H04N 5/2352
  See application file for complete search history.

(56) References Cited

U.S. PATENT DOCUMENTS

| | | | | |
|---|---|---|---|---|
| 7,126,699 | B1* | 10/2006 | Wihl | G01N 21/9501 356/625 |
| 2002/0053643 | A1 | 5/2002 | Tanaka et al. | |
| 2002/0088940 | A1* | 7/2002 | Watanabe | H01J 37/224 250/310 |
| 2002/0093648 | A1* | 7/2002 | Nikoonahad | G01N 21/55 356/73 |
| 2003/0053676 | A1 | 3/2003 | Shimoda et al. | |
| 2005/0194535 | A1* | 9/2005 | Noji | G06T 7/001 250/311 |
| 2006/0276985 | A1* | 12/2006 | Xu | G01C 11/025 702/81 |
| 2007/0069127 | A1* | 3/2007 | Okuda | H01J 37/21 250/310 |
| 2007/0103675 | A1* | 5/2007 | Vodanovic | G01B 11/0608 356/237.1 |
| 2009/0309022 | A1* | 12/2009 | Gunji | H01J 37/28 250/311 |
| 2014/0085457 | A1* | 3/2014 | Staker | G01N 21/6456 356/244 |
| 2014/0130613 | A1* | 5/2014 | Adiga | G01N 1/32 73/864.41 |
| 2014/0152793 | A1* | 6/2014 | Staker | H04N 5/378 348/79 |
| 2014/0278188 | A1* | 9/2014 | Yuditsky | G01N 21/9501 702/151 |
| 2015/0233841 | A1* | 8/2015 | Bobrov | G01N 21/8806 356/237.5 |
| 2016/0249230 | A1* | 8/2016 | Akbar | H04W 24/02 |
| 2017/0153340 | A1* | 6/2017 | Bellinger | G01T 3/00 |
| 2019/0204235 | A1* | 7/2019 | Nishizawa | G01N 21/956 |

FOREIGN PATENT DOCUMENTS

| | | |
|---|---|---|
| JP | 2003151481 A | 5/2003 |
| JP | 2003177101 A | 6/2003 |
| JP | 2005235777 A | 9/2005 |
| JP | 2007051902 A | 3/2007 |
| JP | 2010073507 A | 4/2010 |
| JP | 2014203794 A | 10/2014 |

\* cited by examiner

WAFER INSPECTION APPARATUS AND WAFER INSPECTION METHOD

TECHNICAL FIELD

The present disclosure relates to, for example, a wafer inspection apparatus and a wafer inspection method for inspecting a wafer used in an electronic device.

BACKGROUND ART

When manufacturing a semiconductor device, a minute device is formed on a wafer made of mirror-polished Si, SiC and the like. Presence of foreign matters, scratches, crystal defects and the like on the wafer may lead to a defect of a manufactured device. In order to reduce a defective rate of the manufactured devices, it is important to inspect a surface of the wafer during a manufacturing process and control each manufacturing process. Therefore, there is an attempt to inspect an entire surface of a wafer with an optical wafer inspection apparatus capable of applying light and laser to observe foreign matters and scratches on the wafer surface by reflective light thereof, and recently with a wafer inspection apparatus applying a mirror electron microscope capable of uniformly applying an electron beam and observing the wafer surface and a wafer inner defect by reflected electrons thereof.

Performance required for these inspection apparatuses is high-speed inspection and high recognition accuracy of foreign matters and defects.

It is possible to meet a demand for high-speed inspection (improvement in throughput) by using a time delay integration (TDI) type TDI camera capable of taking images while moving the wafer. However, since the TDI camera takes images while moving the wafer, when the wafer has warpage, an image is distorted due to an effect of an inclination of a measurement position and height variation.

For example, PTL 1 discloses an inspection apparatus using a mirror electron microscope in which an inclination of a measurement position is corrected to correct a deviation of the measurement position. Furthermore, PTL 2 discloses a surface state observation apparatus using a mirror electron microscope in which a stage speed is adjusted to correct distortion aberration of an optical system.

CITATION LIST

Patent Literature

PTL 1: JP 2014-203794 A
PTL 2: JP 2003-151481 A

SUMMARY OF INVENTION

Technical Problem

However, in the inspection apparatus according to PTL 1, an effect of the inclination of the measurement position is taken into consideration, but an effect of height variation is not taken into consideration.

Furthermore, in the surface state observation apparatus according to PTL 2, correction of unevenness of magnification in a visual field of the optical system is taken into consideration, but an effect of height variation of an object to be observed is not taken into consideration. For this reason, even if these technologies are used, it is not possible to sufficiently cope with distortion of an image, and a technology of reducing an effect of height variation is desired.

The present disclosure is achieved in view of such a situation, and an object thereof is to provide a wafer inspection technology with small degradation of image quality even with an object to be observed having height variation due to warpage of the wafer and the like.

Solution to Problem

In order to solve the above-described problems, a wafer inspection apparatus according to the present disclosure is provided with a stage on which a wafer is placed and which moves the wafer; an optical observation unit that optically observes a surface of the wafer; a TDI camera including a time delay integration type image detection element that converts an optical signal obtained by observing the surface of the wafer placed on the stage that moves into an electric signal; a stage position detector that detects a position of the stage; at least one height sensor that measures a height of the surface of the wafer; an imaging optical system control device that controls the optical observation unit; and a camera control device that controls the TDI camera, in which the imaging optical system control device changes optical magnification of the optical observation unit and focuses on the surface of the wafer on the basis of the height of the surface of the wafer measured by the at least one height sensor, and the camera control device corrects a switching timing of the image detection element on the basis of the optical magnification and the position of the stage.

Further features related to the present disclosure will be apparent from the description of the present specification and the accompanying drawings. Furthermore, the aspects of the present disclosure are achieved and realized by elements and combinations of various elements, following detailed description, and the aspects of appended claims.

It should be understood that the description of the present specification is merely a typical example and is not intended to limit the scope of claims or application examples thereof in any way.

Advantageous Effects of Invention

According to the present disclosure, it becomes possible to correct degradation of a TDI camera image due to warpage of a wafer, and it becomes possible to obtain a clear inspection image.

DESCRIPTION OF EMBODIMENTS

Embodiments of the present disclosure are hereinafter described with reference to the accompanying drawings. In the accompanying drawings, the functionally same elements are sometimes represented by the same number. Note that, although the accompanying drawings illustrate specific embodiments and implementation examples according to a principle of the present disclosure, they are for understanding the present disclosure and never used for interpreting the present disclosure in a limited manner.

Although this embodiment is described in detail enough for those skilled in the art to carry out the present disclosure, it should be understood that other implementations/aspects are also possible and configuration/structure may be changed and various elements may be replaced without departing from the scope and spirit of the technical idea of the present disclosure. Therefore, the following description should not be interpreted so as to be limited thereto.

(1) First Embodiment

<Configuration Example of Wafer Inspection Apparatus>

Figure 1:
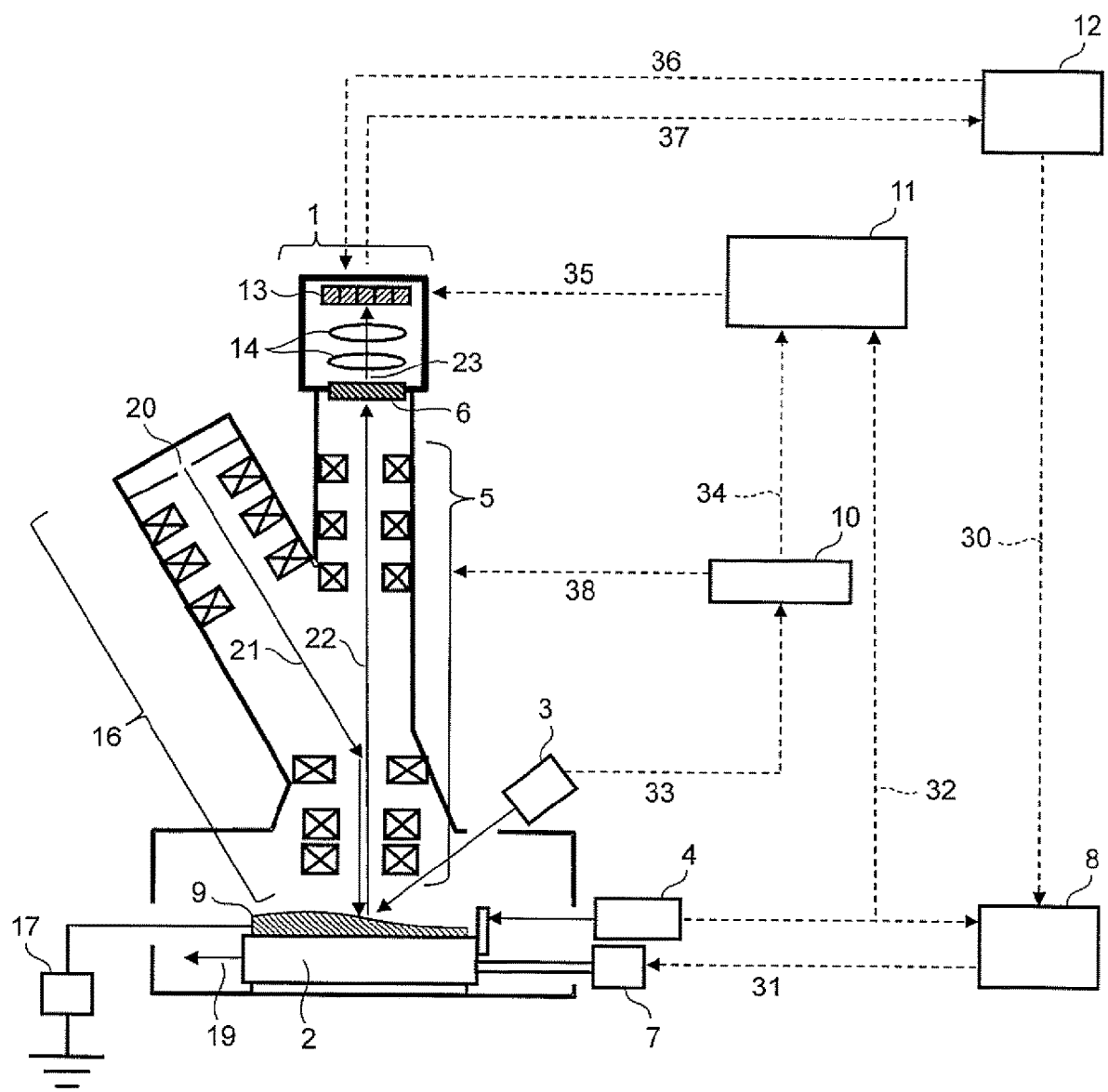
FIG. 1 is a view illustrating a cross-sectional configuration example of a wafer inspection apparatus using a mirror electron microscope according to a first embodiment.

FIG. 1 is a view illustrating a cross-sectional configuration example of a wafer inspection apparatus using a mirror electron microscope according to a first embodiment. In FIG. 1, an incident electron beam 21 generated by an electron source 20 is made a parallel beam having a large diameter by an irradiation optical system 16 to be incident on a surface of a wafer 9. On a stage 2 on which the wafer 9 is placed, negative potential is applied to the wafer 9 by a negative potential applying power source 17 so as to bounce the incident electron beam 21, and the electron beam is reflected by the wafer surface. The reflected electrons are condensed by an imaging optical system 5 as a reflected electron beam 22 to be incident on a fluorescent plate 6. The fluorescent plate 6 converts the same into light 23 proportional to electron beam density. The light may be infrared light, visible light, ultraviolet light, vacuum ultraviolet light, X-ray and the like depending on energy of the reflected electron beam. The light 23 is optically focused by an optical lens 14 to be incident on a TDI camera 1. The stage 2 is at least provided with a stage with two or more axes moving in a horizontal direction and a vertical direction with respect to a paper surface, and is moved in the horizontal direction in a stage advancing direction 19 during inspection.

A height of an observation position on the surface of the wafer 9 is measured by a height sensor 3, and height data 33 of the observation position is input to an imaging optical system control device 10. The imaging optical system control device 10 inputs an imaging optical system control signal 38 to the imaging optical system 5 such that an observation image in a position at the height of the height data 33 is brought into focus on the fluorescent plate 6. The imaging optical system control device 10 calculates optical magnification of the imaging optical system 5 at that time and inputs optical magnification data 34 of the same to the TDI camera control device 11. Then, the TDI camera control device 11 changes the optical magnification of the imaging optical system 5 and focuses on a plane on the wafer 9 the height of which is changed.

The stage 2 is controlled by a stage control device 8 in response to a stage position command 30 from an overall control device 12 such that a speed thereof is kept as constant as possible during image taking. A stage position is observed by a laser interferometer 4, and stage position data 32 is input to the TDI camera control device 11.

An entire wafer inspection apparatus is controlled by the overall control device 12. The overall control device inputs the stage position command (for example, information indicating a rotational speed of a motor) 30 to the stage control device 8, and the stage control device 8 supplies a position control signal (information of coordinate position) 31 to a stage driving device 7 in response to the same to control the position of the stage 2 to a desired place. Furthermore, the overall control device 12 supplies an image ON-OFF signal (clock adjusting signal) 36 to the TDI camera 1, controls imaging and shooting, and obtains image data 37.

The TDI camera control device 11 inputs a line switching signal 35 to the TDI camera 1 at a timing at which the stage 2 moves by one line width of a CCD line sensor 13 from the magnification data 34 and the stage position data 32. By using this switching signal as a signal in consideration of the magnification data 34 corresponding to the height data of the wafer, a height-corrected image may be obtained.

<Principle of Camera Control>

Figure 2:
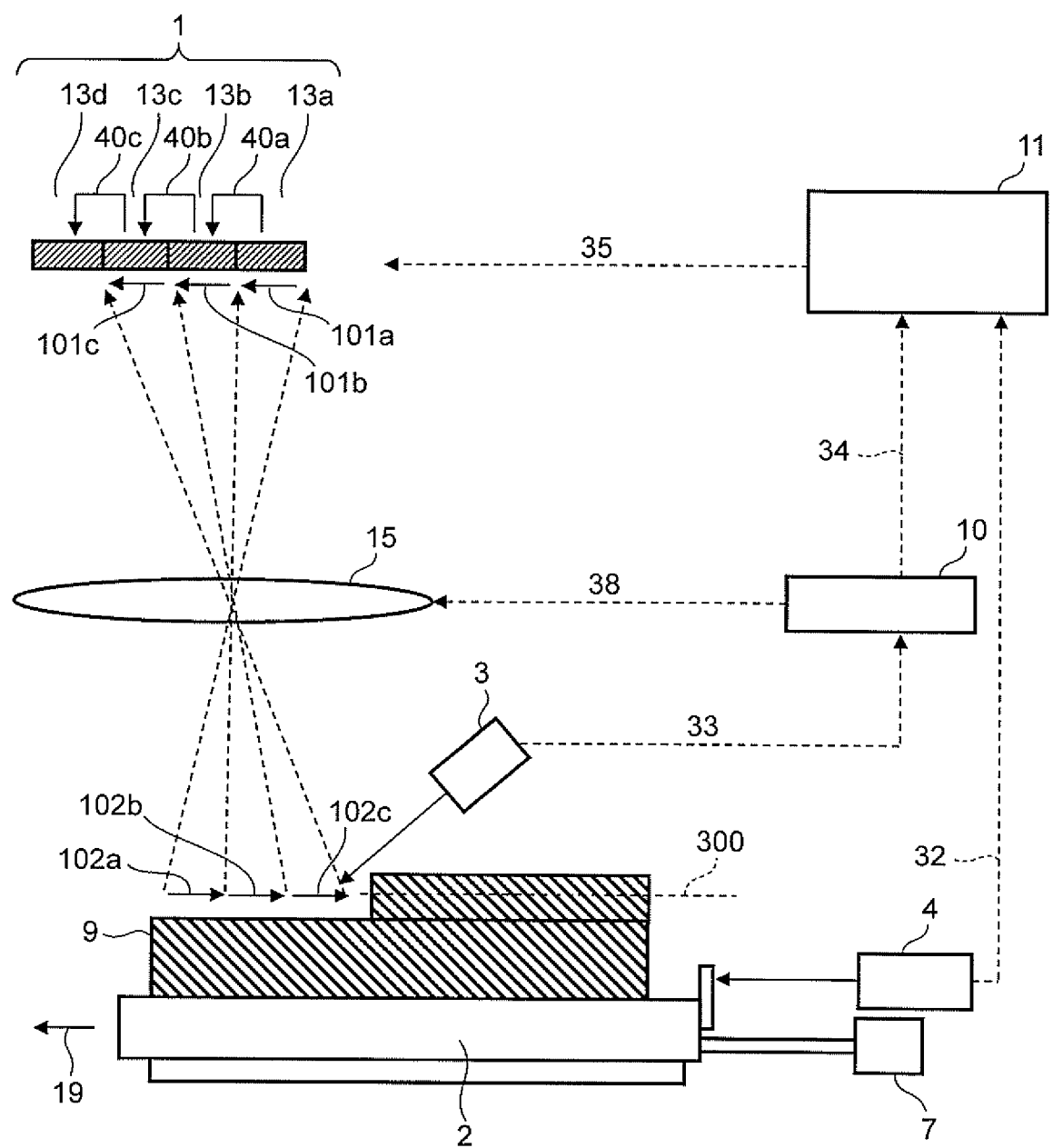
FIG. 2 is a view for illustrating a principle of a camera control system.
Figure 3:
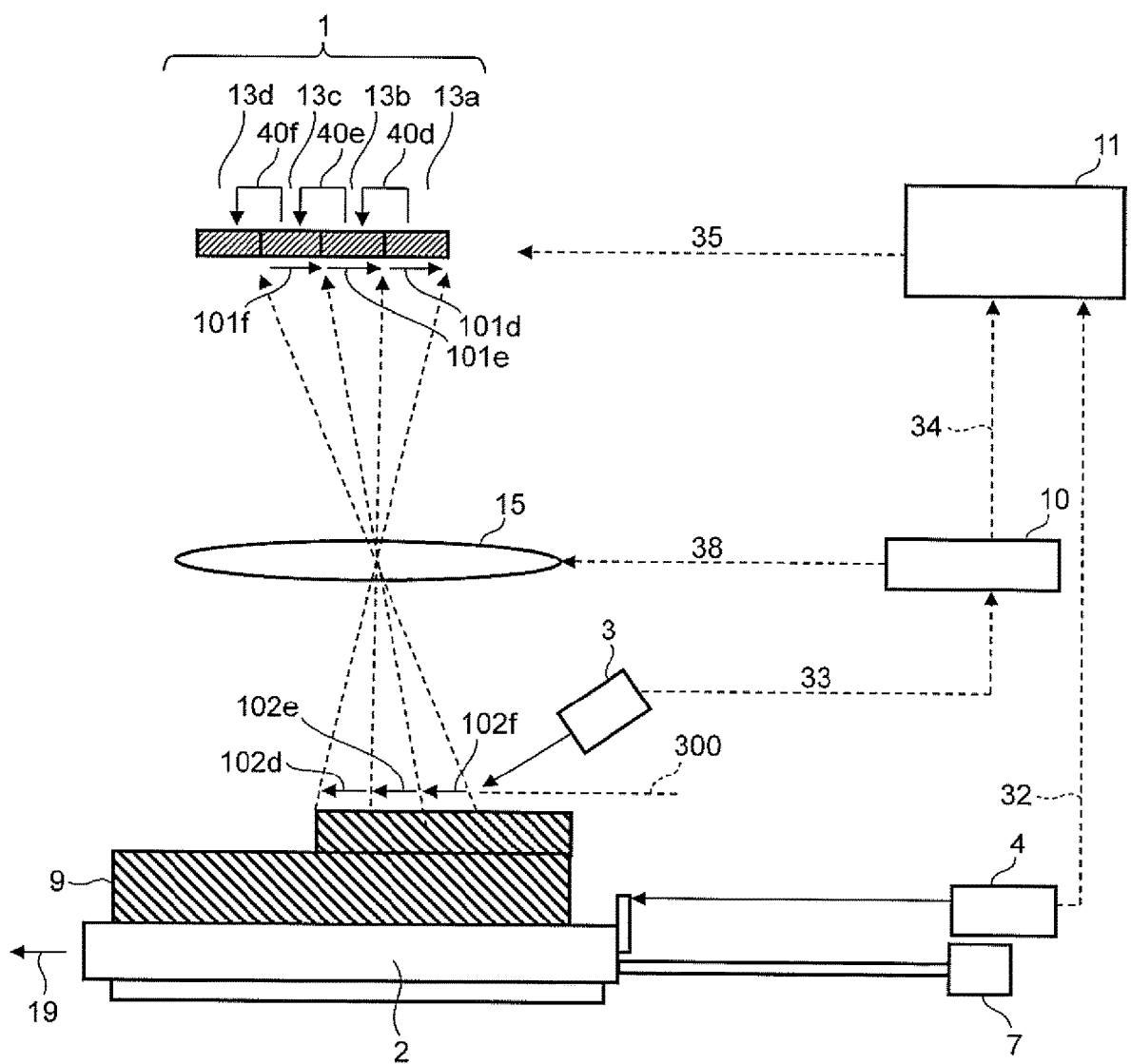
FIG. 3 is a view for illustrating a principle of a camera control system.

FIGS. 2 and 3 are views for illustrating a principle of a camera control system. FIGS. 2 and 3 are schematic diagrams obtained by simplifying FIG. 1 in which the wafer is illustrated as having a step shape of two-stage heights for easier understanding, and illustrate a condition of observing the surface of the wafer 9 at each height. Furthermore, in FIGS. 2 and 3, the imaging optical system 5 in FIG. 1 is simply represented by a single lens 15.

FIG. 2 illustrates a state in which a left half of the wafer is observed. The height of the observation position on the surface of the wafer 9 is measured by the height sensor 3, and the height data 33 of the observation position is input from the height sensor 3 to the imaging optical system control device 10. The imaging optical system control device 10 inputs the imaging optical system control signal 38 to the lens 15 such that an image on an observation plane 300 on the wafer is brought into focus on the fluorescent plate 6 in accordance with the height of the height data 33. The imaging optical system control device 10 calculates optical magnification of the lens 15 at that time and inputs the optical magnification data 34 to the TDI camera control device 11. The stage 2 is controlled such that a speed thereof is kept as constant as possible during image taking, the stage position is observed by the laser interferometer 4, and the stage position data 32 is input to the TDI camera control device 11.

A situation in which a certain point on the wafer is observed in the above-described state is described. In a period of time in which a certain point moves in a portion corresponding to a moving distance 102a, this point is observed by the CCD line sensor 13a. Then, at a timing at which a distance 101a obtained by transferring a distance corresponding to the moving distance 102a to the CCD line sensor by the lens 15 becomes equal to the width of the CCD line sensor, the line switching signal 35 is input to the TDI camera 1. When this line switching signal 35 is input, the TDI camera 1 transfers charges accumulated by converting an optical signal by the CCD line sensor 13a to a CCD line sensor 13b through a route indicated by charge transfer 40a.

Next, in a period of time in which a certain point moves in a portion corresponding to a moving distance 102b, this point is observed by the CCD line sensor 13b, and the TDI camera 1 converts the optical signal also by the CCD line sensor 13b to accumulate the charges in addition to the charges by the CCD line sensor 13a. In this manner, the TDI camera 1 may sequentially accumulate the charges similarly by CCD line sensors 13c and 13d, thereby converting the optical signal into the charges to accumulate while observing the same point by the adjacent line sensors, so that this may obtain a bright image. A method of taking an image while integrating the charges by the CCD line sensors is referred to as a time delay integration method, and an integration time in which an image of a certain point is taken while repeatedly integrating by the number of line sensors is referred to as a time delay integration time.

Since the TDI camera 1 includes about 64, 128, 256, and 512 CCD line sensors, it becomes possible to obtain a brighter image as the time delay integration time becomes longer.

Herein, when the optical magnification, the width of the CCD line sensor, and the stage moving distance are represented by f1, W, and d, respectively, when the TDI camera control device 11 operates so as to input the line switching signal 35 to the TDI camera at a timing at which Equation (1) is satisfied, a condition of taking an ideal image as the TDI camera is realized.

$$W = f1 * d \tag{1}$$

The stage moving distance may be calculated by calculating the moving distance from the stage position data 32 from the laser interferometer 4.

Next, FIG. 3 illustrates a state in which a right half of the wafer 9 is observed. This differs from FIG. 2 only in that the wafer height in the observation position is different, and the control method and the like are exactly similar. Because the wafer height is different, the optical magnitude set by the imaging optical system control device 10 also becomes a different value; when the optical magnification, the width of the CCD line sensor, and the stage moving distance are represented by f2, W, and d, respectively, when the TDI camera control device 11 operates so as to input the line switching signal 35 to the TDI camera at a timing at which Equation (2) is satisfied, a condition of taking an ideal image as the TDI camera is realized.

$$W = f2 * d \tag{2}$$

As described above, by adjusting the timing of generating the line switching signal 35 each time the height changes, it becomes possible to observe the wafer surface the height of which changes. Specifically, the height sensor 3 detects the change in height, and the magnification is changed. Then, by changing an output clock (line switching signal 35) from the information of the (change in) magnification and the moving distance of the stage 2, a focal position may be changed.

<Method of Imaging Smooth Curved Surface>

Figure 4:
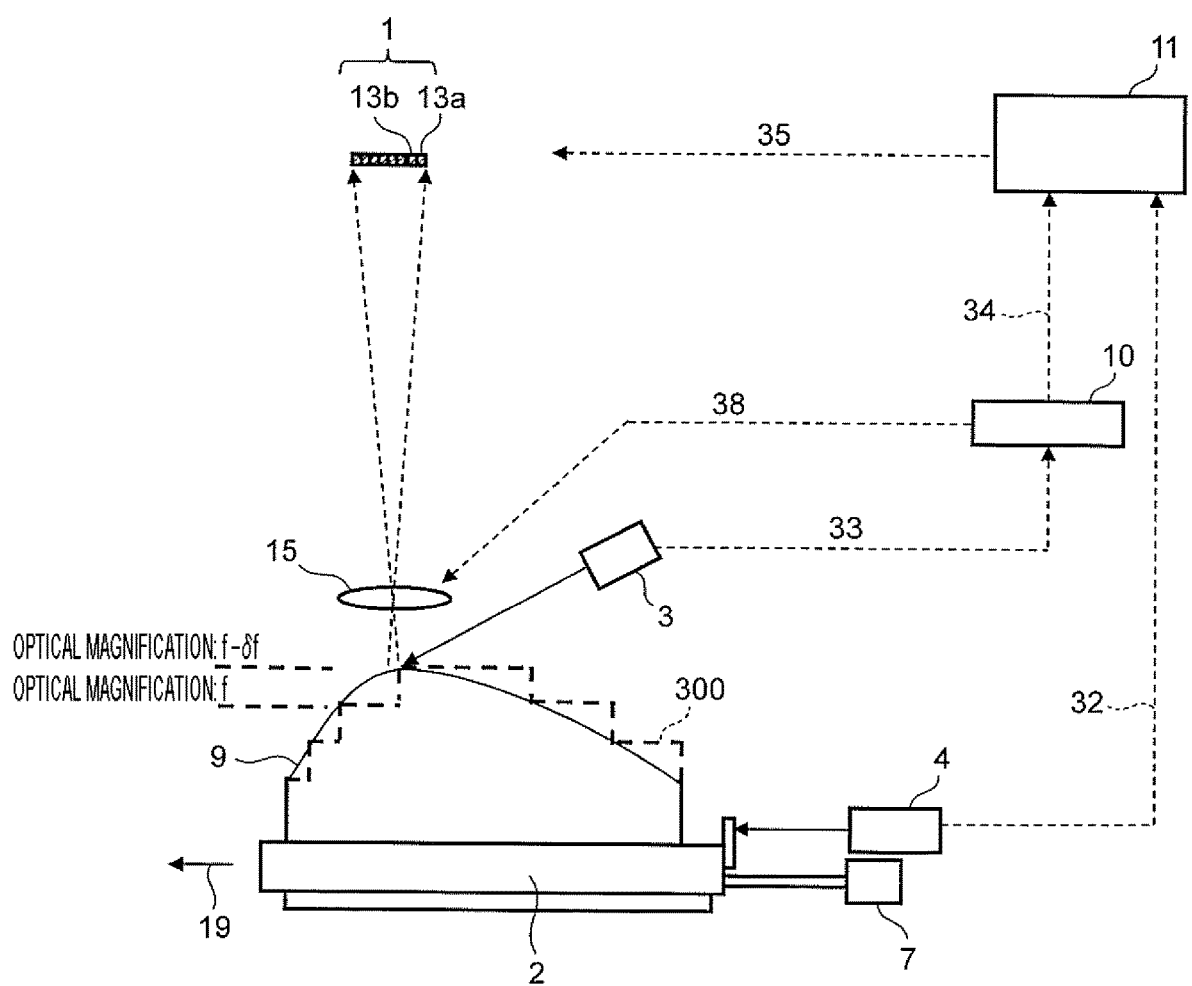
FIG. 4 is a view for illustrating a method of imaging a smooth curved surface using the camera control principle.

FIG. 4 is a view for illustrating a method of imaging a smooth curved surface using the above-described camera control principle. FIG. 4 differs from FIGS. 2 and 3 only in the cross-sectional shape of the wafer 9.

When the height data is finely measured by the height sensor 3 and the observation plane 300 is set in accordance with the same, a curved surface may be smoothly imaged. However, in this case, the number of times of calculation of the imaging optical system control device 10 and the TDI camera control device 11 becomes enormous, and it becomes highly possible that the control system cannot catch up with this. Therefore, in this embodiment, a method of adjusting the optical magnification at a timing at which the wafer height in the observation position changes and an error from ideal optical magnification f occurs by δf is used. Herein, δf is referred to as an optical magnification error tolerance. From this viewpoint, the observation plane 300 has a stepped shape.

However, when the optical magnification tolerance δf is large, the magnification drastically changes when the TDI camera 1 images, and a visual field instantaneously changes, so that the image might be disturbed. Therefore, it is necessary to find a condition of the optical magnification tolerance δf capable of reducing image distortion.

Figure 5:
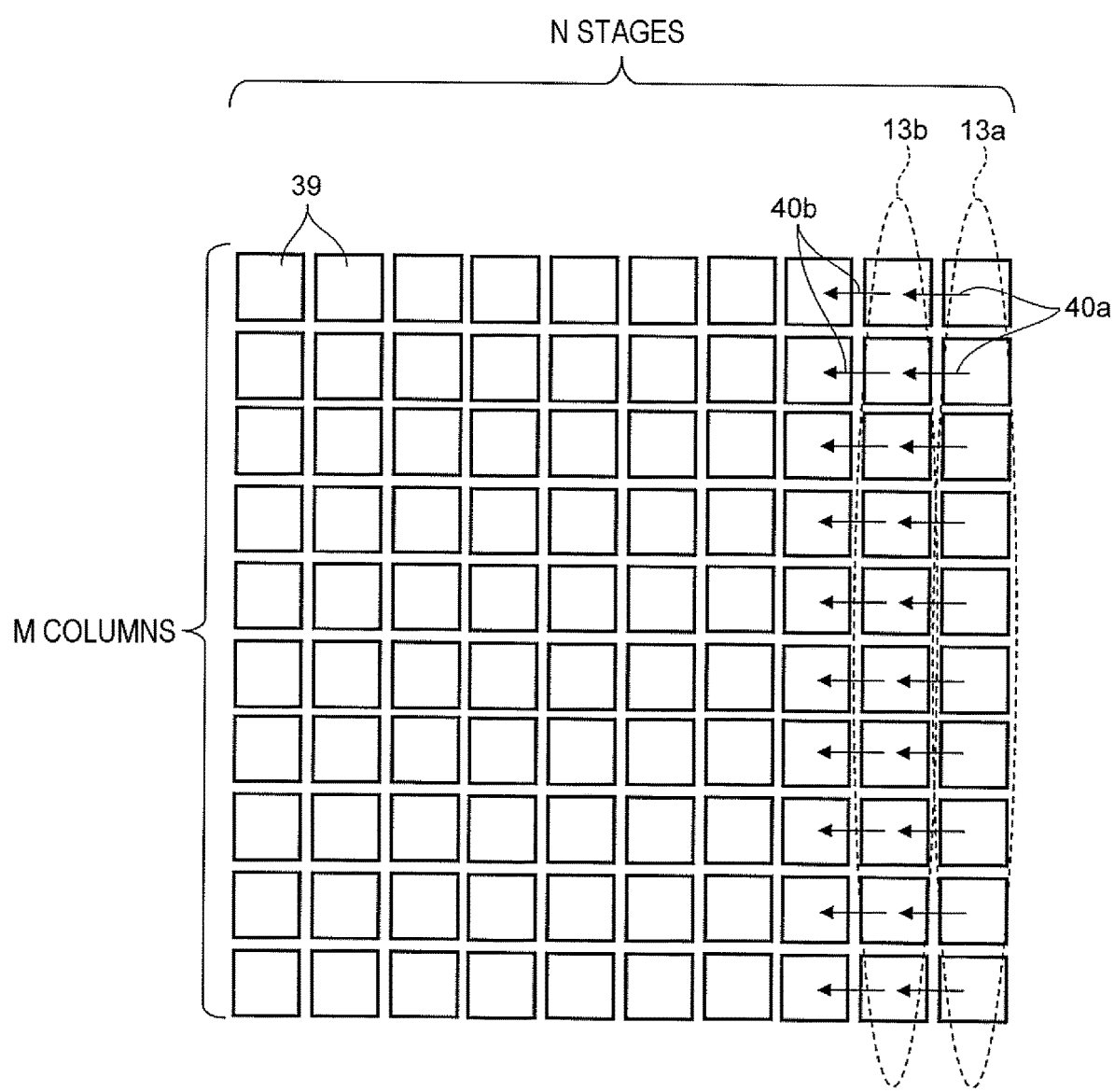
FIG. 5 is a top view illustrating a state in which a CCD line sensor 13 is seen from a lens 15 side.

FIG. 5 is a top view illustrating a state in which the CCD line sensor 13 is seen from a lens 15 side. The CCD line sensor 13 is formed of a plurality of CCD pixels arranged in an up-and-down direction in the paper surface. The number of pixels forming the CCD line sensor 13 is M. Furthermore, N stages of CCD line sensors 13 form the TDI camera 1. In the charge transfer 40a and 40b when the line switching signal 35 is input illustrated in FIG. 3, the charges are transferred to the horizontally adjacent pixels two-dimensionally.

Figure 6:
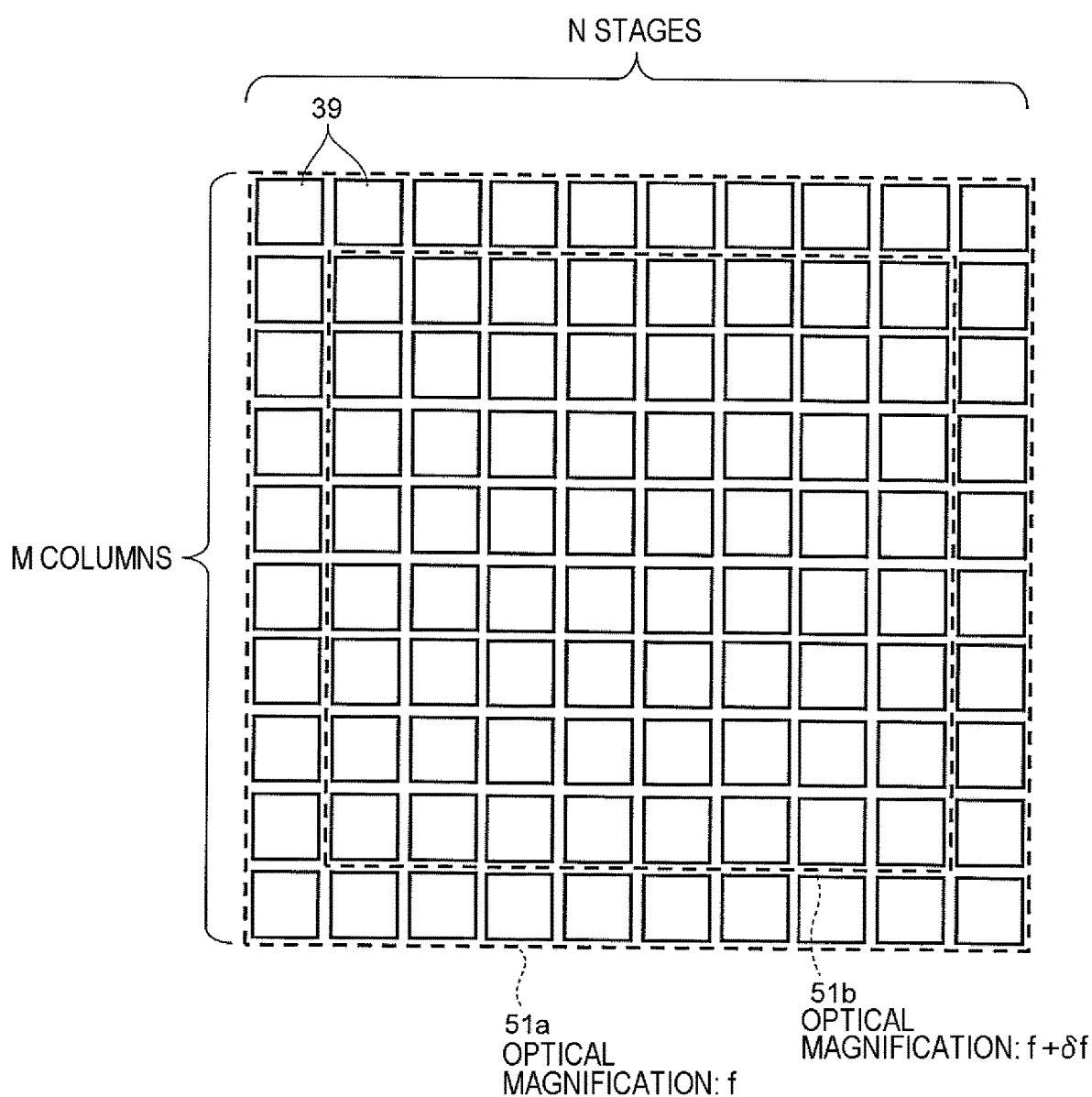
FIG. 6 is a view for illustrating a visual field when optical magnification is different.

FIG. 6 is a view for illustrating the visual field when the optical magnification is different. With reference to FIG. 6, a case where a visual field 51a at the optical magnification f changes to a visual field 51b with optical magnification f+δf in the time delay integration time in the TDI camera 1 is considered. It is known that the CCD camera may tolerate fluctuations of about two adjacent pixels due to vibration of the device, electrical noise and the like. Therefore, it is understood that, under a condition in which the change in visual field in the time delay integration time is by one pixel (two pixels on both sides) or smaller, the change in the optical magnification does not affect the image of the TDI camera. As the condition, a direction in which the CCD line sensors 13 are arranged (horizontal direction on the paper surface) is first considered. As in Equation (1), when the optical magnification, the width of the CCD line sensor 13 in this direction, and the moving distance of the stage 2 are represented by f, W, and d, respectively, Equation (3) is established.

$$W = f * d \tag{3}$$

By multiplying Equation (3) by N, Equation (4) is obtained.

$$N*W = f*(N*d) \tag{4}$$

Equation (4) expresses that a distance N*d seems to a distance N*W in the direction in which the CCD line sensors are arranged in the visual field 51a in FIG. 6 (horizontal direction on the paper surface). When the visual field 51a becomes the visual field 51b due to the change to the magnification f+δf, this may be expressed as in Equation (5).

$$(N-2)*W = (f+\delta f)*(N*d) \tag{5}$$

Herein, by subtracting Equation (4) from Equation (5), Equation (6) may be obtained.

$$\delta f/f = -2/N \tag{6}$$

From Equation (6), a range of magnitude of optical magnification variation δf that does not affect the image of the TDI camera 1 by the change in the optical magnification in the direction in which the CCD line sensors 13 are arranged may be expressed by Equation (7) when the number of stages of the CCD line sensors of TDI is set to N.

$$|\delta f/f| < 2/N \quad (7)$$

Therefore, it is understood that the image of the TDI camera is not affected by an optical magnification change amount δf that satisfies the condition of Equation (7).

Similarly, a condition as for a direction in which the pixels are arranged of the CCD line sensor 13 (up-and-down direction on the paper surface) is as follows: when the number of the pixels in a column of the CCD line sensor 13 is set to M, and the optical magnification, the width in the direction of the pixel of the CCD line sensor 13, and a seeming width on the stage 2 of the CCD line sensor 13 of the width W are represented by f, W, and e, respectively, an equation corresponding to Equation (3) becomes Equation (8).

$$W = f^* e \quad (8)$$

After that, by similarly solving while replacing N with M, a range of the magnitude of the optical magnification variation δf that does not affect the image of the TDI camera 1 by the change in the optical magnification in the direction in which the pixels of the CCD line sensors 13 are arranged is expressed by Equation (9) when the number of pixels in a column of the CCD line sensor 13 of the TDI camera 1 is set to M.

$$|\delta f/f| < 2/M \quad (9)$$

From Equations (7) and (8), the larger the number of pixels, the smaller the optical magnification tolerance δf should be made; for example, in the TDI camera with M=N=1024, this should be made |δf/f|<0.195%, and with M=N=256, this should be |δf/f|<0.781%, so that it is understood that the optical magnification tolerance δf should be made 1% or smaller even with the TDI camera of a small number of pixels.

Note that, there also is a method of controlling by setting a tolerance in height variation instead of the optical magnification tolerance. For example, in a case of the mirror electron microscope with optical magnification of 65 times, when the height changes by about 100 μm, the optical magnification changes by about 1%. In this case, a height tolerance is 19.5 μm or smaller in the TDI camera 1 with M=N=1024 and 78.1 μm or smaller with M=N=256.

By setting the tolerance in this manner, and observing the observation plane 300 while the observation plane 300 is set and the height is corrected as illustrated in FIG. 4, it becomes possible to clearly take an image of the wafer surface with large warpage.

(2) Second Embodiment

<Configuration Example of Wafer Inspection Apparatus>

Figure 7:
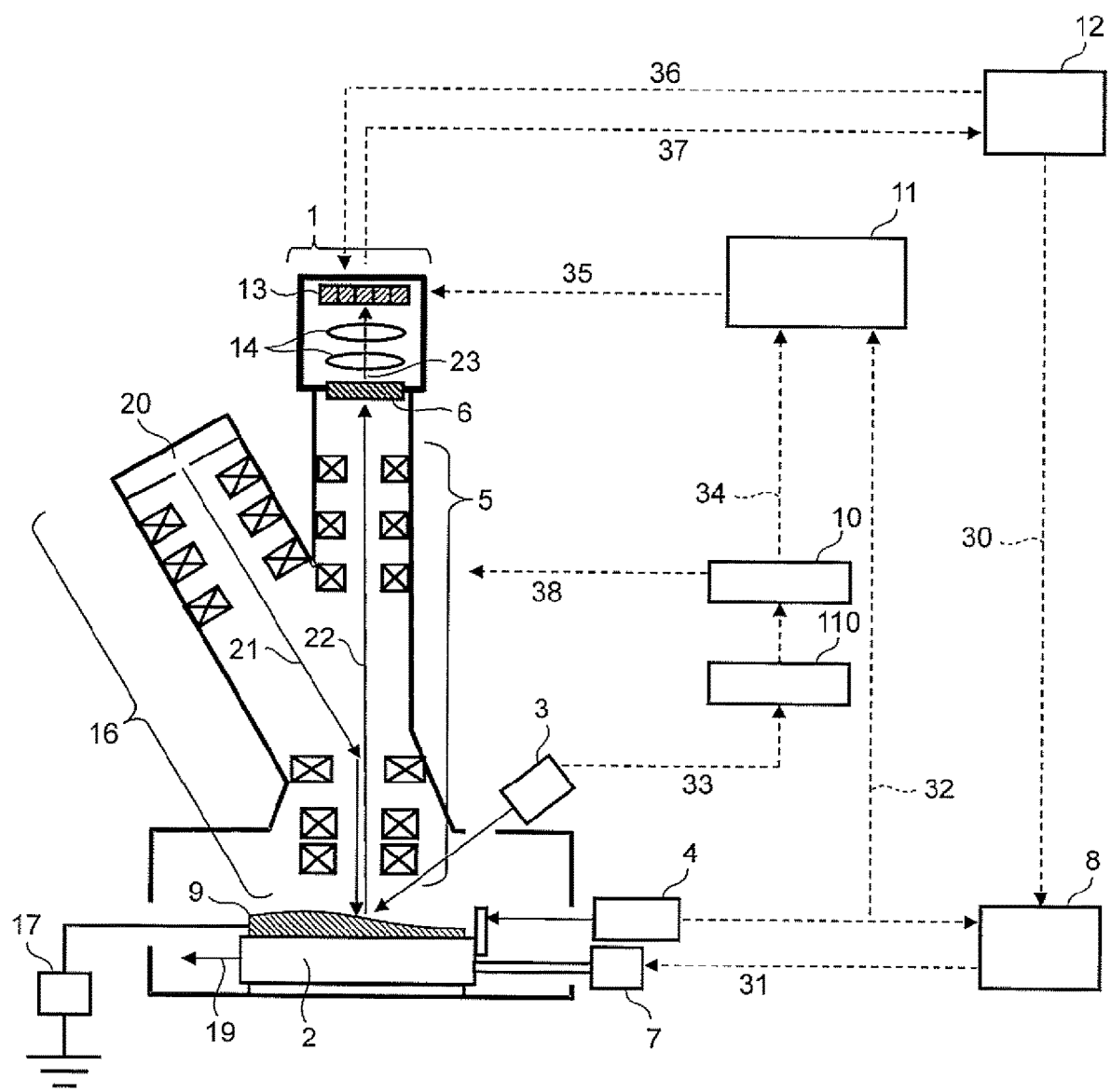
FIG. 7 is a view illustrating a cross-sectional configuration example of a wafer inspection apparatus using a mirror electron microscope according to a second embodiment.

FIG. 7 is a view illustrating a cross-sectional configuration example of a wafer inspection apparatus using a mirror electron microscope according to a second embodiment. In FIG. 7, components 1 to 38 are the same as those in FIG. 1. The wafer inspection apparatus according to the second embodiment is provided with a height data buffer 110 unlike the wafer inspection apparatus according to the first embodiment (FIG. 1). The buffer 110 temporarily stores to save past height data.

<Utilization of Past Height Data>

Figure 8:
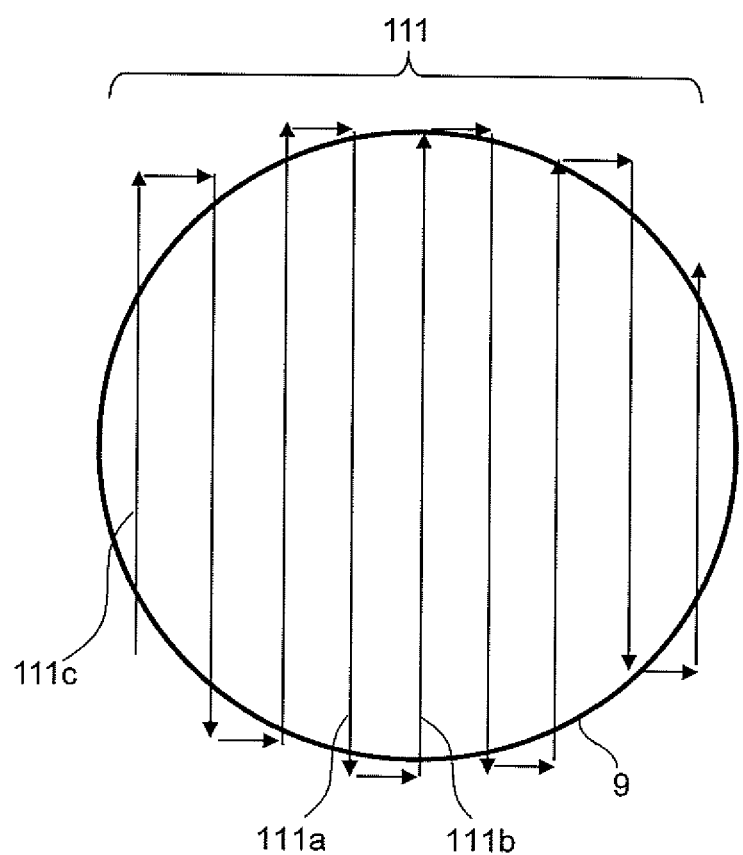
FIG. 8 is a view illustrating a trajectory 111 of inspection on a wafer.

FIG. 8 is a view illustrating a trajectory 111 of inspection on a wafer. The inspection of a wafer 9 is performed by taking images with a TDI camera 1 while moving a stage 2 in an up-and-down direction. When the images are taken up to a wafer edge, the stage 2 temporarily stops and moves in a horizontal direction on a paper surface by an amount of about one visual field of the TDI camera 1, and moves again in an opposite direction, then the image is taken. Herein, for example, adjacent trajectories 111a and 111b are apart from each other only by a distance of about one visual field (for example, 100 μm), so that they may be regarded as substantially the same in height. Therefore, it is possible to store height data 33 collected by a height sensor 3 during imaging of the trajectory 111a in the buffer 110, and perform height correction by using the height data stored in the buffer 110 (height data obtained by imaging of the trajectory 111a) during the imaging of the trajectory 111b. In this method, it becomes possible to prepare in advance a timing for generating a line switching signal 35 before imaging, and it is not necessary to calculate while measuring the height during image taking. However, since the height data is not stored in the buffer 110 in a first trajectory 111c (there is no past height data), processing of moving once in the same trajectory to store the height data in the buffer 110 is necessary only for 111c. Note that the past height data to be used is not necessarily the data obtained by imaging of an immediately preceding trajectory. For example, it is also possible to use the past height data about once for imaging of 10 lines of trajectories.

(3) Third Embodiment

<Configuration Example of Wafer Inspection Apparatus>

Figure 9:
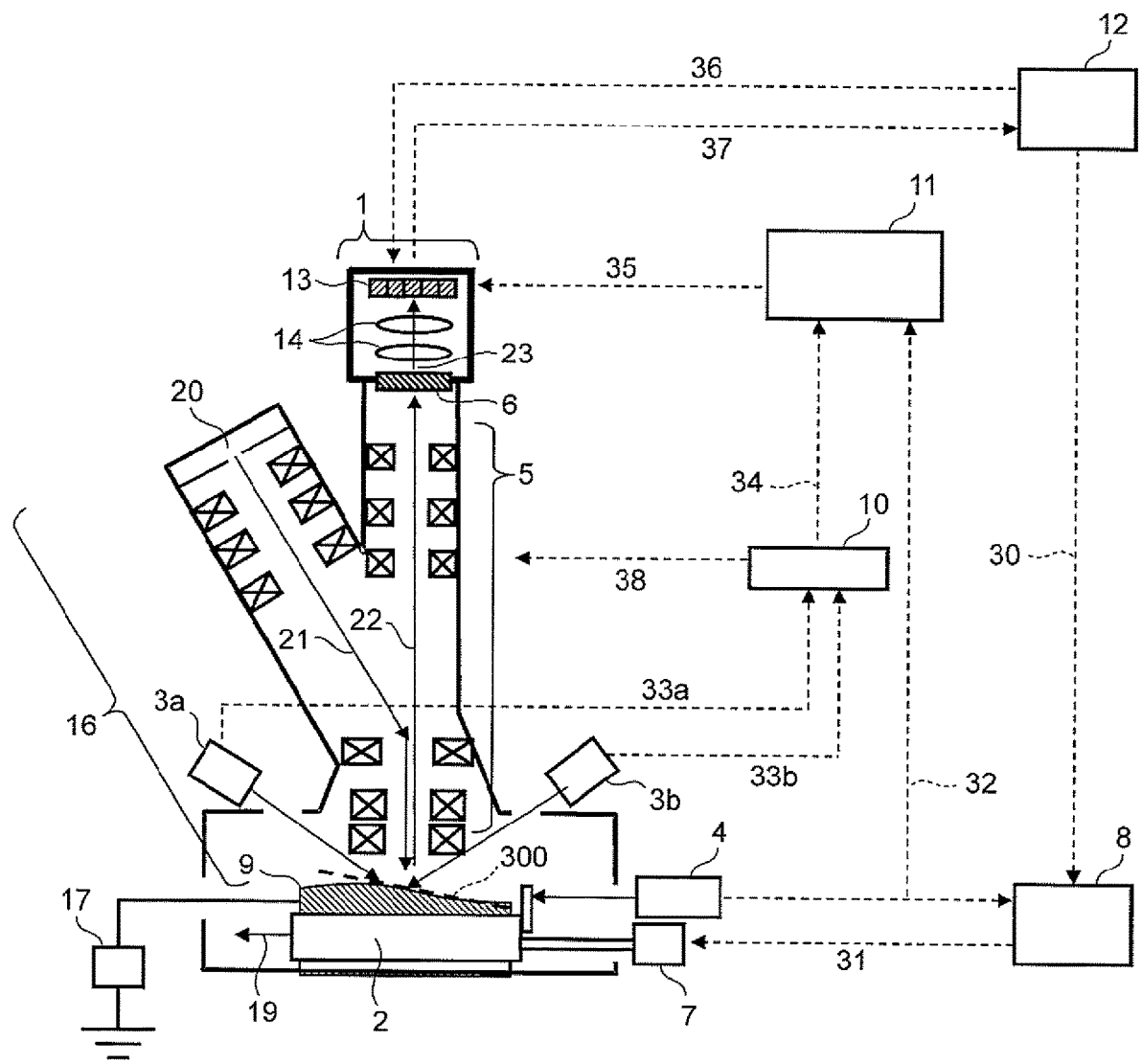
FIG. 9 is a view illustrating a cross-sectional configuration example of a wafer inspection apparatus using a mirror electron microscope according to a third embodiment.

FIG. 9 is a view illustrating a cross-sectional configuration example of a wafer inspection apparatus using a mirror electron microscope according to a third embodiment. In FIG. 9, components 1 to 38 are the same as those of the wafer inspection apparatus according to the first embodiment (FIG. 1). However, the wafer inspection apparatus according to the third embodiment is different from the wafer inspection apparatus of the first embodiment (FIG. 1) in that two height sensors are installed and heights of at least two points in a stage advancing direction of an observation position may be measured. Note that, in this embodiment, an example in which the two height sensors are provided is illustrated, but it is also possible to provide three or more height sensors and approximate an observation plane 300 on the basis of respective measurement results.

<Operation of Two-Point Height Measurement>

Figure 10:
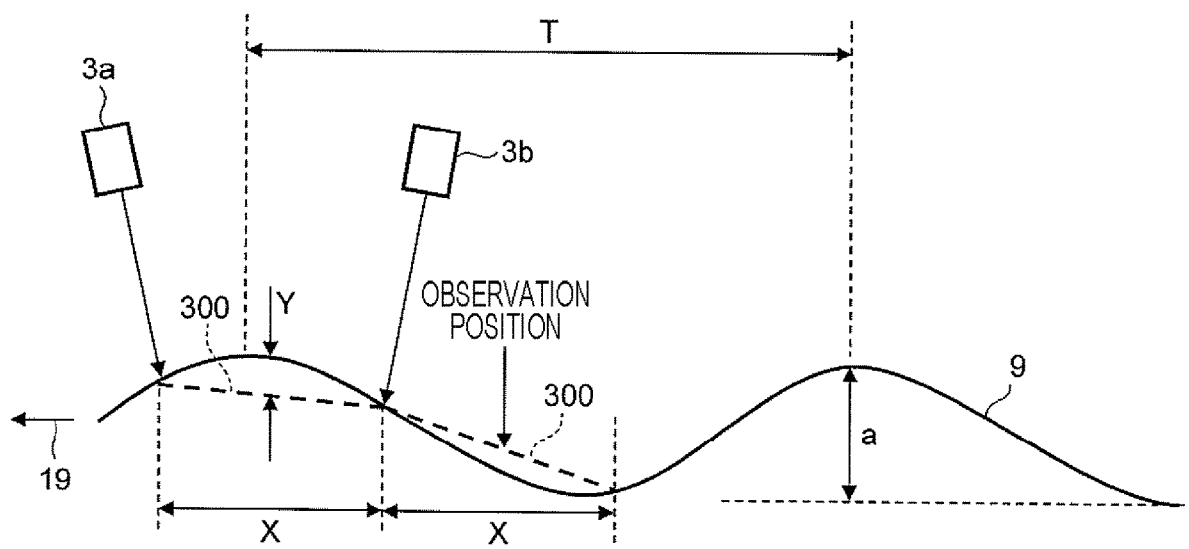
FIG. 10 is a view for illustrating observation plane calculation processing by measuring heights of two points.

FIG. 10 is a view for illustrating observation plane calculation processing by measuring heights of two points. In FIG. 10, a height sensor 3a and a height sensor 3b measure two points separated from each other by a distance X in front of the observation position, and the observation plane 300 is calculated by approximating the two points by a straight line in an imaging optical system control device 10. The wafer 9 is moved in a stage advancing direction 19 and data of the calculated observation plane 300 is prepared in advance. In this manner, it is possible to reduce the number of times of calculation while measuring the height during image taking.

The smaller the distance X is set, the smaller a height error Y obtained by approximating the observation plane 300 by a straight line may be made, but the number of times of calculation increases. It is assumed that magnitude and a period of height variation of the wafer 9 illustrated in FIG. 10 are a and T, respectively. When X is smaller than T, the height error Y at that time may be estimated as in Equation (10).

$$Y \approx a^*(X/T) \quad (10)$$

From Equation (10), a condition of the distance X for making the error smaller than the error Y is as expressed in Equation (11).

$$X < Y*T/a \quad (11)$$

For example, in a case of the mirror electron microscope with optical magnification of 65 times, when the height changes by about 100 μm, the optical magnification changes by about 1%. In this case, a height tolerance is 19.5 μm or smaller in a TDI camera 1 with M=N=1024. Considering the height error Y as the height tolerance, Y=19.5 μm is obtained. Assuming that the center of the wafer with a diameter of 150 mm is warped by 100 μm and the period T is set to 150 mm and a is set to 100 μm, X<19.5*150/100=29.3 mm is obtained from Equation (11), so that it is understood that it is only required to make the distance X smaller than 29.3 mm.

Note that, in this embodiment, the calculation of obtaining the observation plane 300 described above is executed each time a stage 2 moves by the distance X; however, for example, it is also possible to calculate the observation plane 300 each time the stage moves by a distance 2X and utilize the obtained observation plane with the distance of 2X.

(4) Fourth Embodiment

Figure 11:
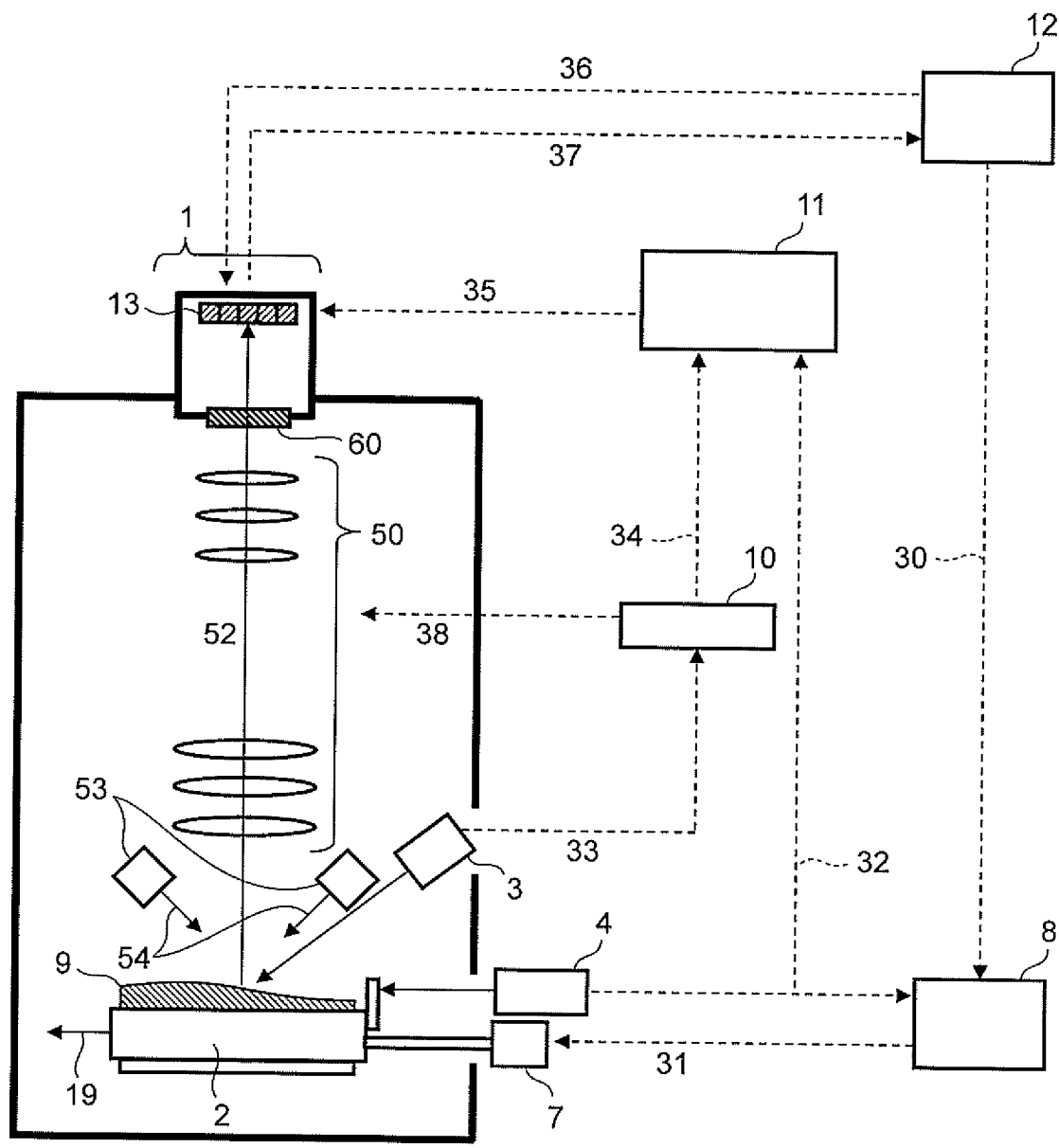
FIG. 11 is a view illustrating a cross-sectional configuration example of a wafer inspection apparatus using an optical microscope according to a fourth embodiment.

FIG. 11 is a view illustrating a cross-sectional configuration example of a wafer inspection apparatus using an optical microscope according to a fourth embodiment. In FIG. 11, components 1 to 38 are the same as those of the wafer inspection apparatus according to the first embodiment (FIG. 1). The wafer inspection apparatus according to the fourth embodiment is different from the wafer inspection apparatus according to the first embodiment which observes by applying an electron beam, and observes a wafer 9 by irradiating the wafer 9 with light 54 by a light source 53 and condenses reflected light 52 thereof on a CCD line sensor 13 through a window 60 of a TDI camera 1 by a condenser lens 50.

The light source 53 is desirably a single-wavelength light source in order to eliminate chromatic aberration as much as possible on purpose that an image is captured at high optical magnification, for example. Therefore, it is desirable to limit the wavelength by using a bandpass filter at an outlet of the light source 53, or to use an LD light source, a laser light source, an X-ray source and the like.

The wafer inspection apparatus according to the fourth embodiment has a configuration similar to that of the wafer inspection apparatus according to the first embodiment except for the above-described configuration, and it is possible to apply the functions and configurations according to the second to fourth embodiments, which is similarly effective.

(5) Summary (i) In this embodiment, the imaging optical system control device 10 focuses on the surface of the wafer by changing the optical magnification of an optical observation unit (5 and 16 or 50 and 53) on the basis of the height of the surface of the wafer 9 measured by at least one height sensor 3, and a camera control device (TDI camera control device 11) corrects a switching timing of an image detection element (CCD line sensor 13 of the TDI camera 1) on the basis of the optical magnification and the position of the stage 2. By doing so, it becomes possible to suppress degradation of an image quality even for an object to be observed with height variation due to the warpage, step and the like of the wafer, and to obtain a high-quality observation image.

(ii) In the first to third embodiments, as the optical observation unit, for example, the mirror electron microscope provided with the electron source 20, the irradiation optical system 16 that irradiates the wafer 9 with a plane-shaped incident electron beam from the electron source 20, the negative potential applying power source 17 that applies the negative potential to the surface of the wafer 9, a condensing optical system (imaging optical system 5) that condenses the reflected electron beam reflected by the negative potential formed on the surface of the wafer 9, and the fluorescent plate 6 that converses the light condensed by the condensing optical system into an electric signal may be used. By doing so, it is possible to inspect an entire surface of the wafer 9 while coping with the height variation, realize high-speed inspection, and recognize foreign matters and defects with high accuracy.

(iii) Furthermore, in the fourth embodiment, as the optical observation unit, for example, the optical microscope that is provided with the light source 53, an irradiation unit that irradiates the wafer 9 with light emitted from the light source 53 (irradiation optical system not illustrated), and the condenser lens 50 that condenses the reflected light reflected by the surface of the wafer 9 and that observes the condensed light may be used. By doing so, it becomes possible to inspect the entire surface of the wafer 9 with a relatively simple configuration while coping with the height variation.

(iv) Moreover, in this embodiment, the camera control device (TDI camera control device 11) corrects the switching timing of the image detection element (CCD line sensor 13) such that a change in optical magnification of the optical observation unit is 1% or smaller. By doing so, it is possible to prevent the visual field from changing drastically in the obtained image.

(v) In the second embodiment, the wafer inspection apparatus is provided with the buffer 110 that stores the height data of the surface of the wafer 9, and temporarily stores the height data of the wafer 9 obtained during the past inspection. In this case, the camera control device (TDI camera control device 11) corrects the switching timing of the image detection element (CCD line sensor 13) by using the past height data stored in the buffer 110 as the trajectory (refer to FIG. 8) along which reciprocating inspection is performed on the wafer 9 to inspect while the observation position is shifted on the surface of the wafer 9. By doing so, it becomes not necessary to calculate the switching timing while measuring the height of the wafer 9 during image taking, and high-speed processing may be realized.

(vi) In the third embodiment, at least two wafer height sensors 3a and 3b are provided. In this case, at least two points of the height of the surface of the wafer are observed by using the at least two wafer height sensors 3a and 3b, and the imaging optical system control device 10 estimates the surface of the wafer 9 in an inclined approximation plane on the basis of the height data of the observed at least two points. Then, the camera control device (TDI camera control device 11) corrects the switching timing of the image detection element (CCD line sensor 13) such that the height of the surface of the wafer 9 becomes an estimated height of the approximation plane. In this manner, since the height is estimated using the approximation plane, the number of times of measurement of the height may be reduced, and the high-speed processing speed may be realized.

REFERENCE SIGNS LIST

1 TDI camera
2 stage 3 height sensor
4 laser interferometer
5 imaging optical system
6 fluorescent plate
7 stage driving device
8 stage control device
9 wafer
10 imaging optical system control device
11 TDI camera control device
12 overall control device
13 CCD line sensor
14 optical lens
15 lens
16 irradiation optical system
17 negative potential applying power source
19 stage advancing direction
20 electron source
21 incident electron beam
22 reflected electron beam
30 stage position command
31 position control signal
32 stage position data
33 height data
34 optical magnification data
35 line switching signal
36 image ON-OFF signal
37 image data
38 imaging optical system control signal
39 CCD pixel
40 charge transfer
50 condenser lens
51 visual field
52 reflected light
53 light source
64 light
60 window
101 transfer distance
102 moving distance
110 buffer
111 trajectory
300 observation plane

The invention claimed is:

1. A wafer inspection apparatus comprising:
 a stage on which a wafer is placed and which moves the wafer;
 an optical observation unit that optically observes a surface of the wafer;
 a TDI camera including a time delay integration type image detection element that converts an optical signal obtained by observing the surface of the wafer placed on the stage that moves into an electric signal;
 a stage position detector that detects a position of the stage;
 at least one height sensor that measures a height of the surface of the wafer;
 an imaging optical system control device that controls the optical observation unit; and
 a camera control device that controls the TDI camera, wherein
 the imaging optical system control device changes optical magnification of the optical observation unit and focuses on the surface of the wafer on the basis of the height of the surface of the wafer measured by the at least one height sensor, and
 the camera control device corrects a switching timing of the image detection element on the basis of the optical magnification and the position of the stage.

2. The wafer inspection apparatus according to claim 1, wherein the optical observation unit is a mirror electron microscope provided with an electron source, an irradiation optical system that irradiates the wafer with a plane-shaped incident electron beam from the electron source, a negative potential applying power source that applies negative potential to the surface of the wafer, a condensing optical system that condenses a reflected electron beam reflected by the negative potential formed on the surface of the wafer, and a fluorescent plate that condenses by the condensing optical system to convert light into an electric signal.

3. The wafer inspection apparatus according to claim 1, wherein the optical observation unit is an optical microscope that is provided with a light source, an irradiation unit that irradiates the wafer with light emitted from the light source, and a condenser lens that condenses reflected light reflected by the surface of the wafer, and that observes the condensed light.

4. The wafer inspection apparatus according to claim 1, wherein the camera control device corrects the switching timing of the image detection element such that a change in optical magnification of the optical observation unit is 1% or smaller.

5. The wafer inspection apparatus according to claim 1, further comprising:
 a buffer that stores height data of the surface of the wafer,
 wherein the camera control device corrects the switching timing of the image detection element by using past height data stored in the buffer as a trajectory along which reciprocating inspection is performed on the wafer while an observation position is shifted on the surface of the wafer.

6. The wafer inspection apparatus according to claim 1, comprising:
 at least two height sensors,
 wherein
 the at least two height sensors observe at least two points of height of the surface of the wafer,
 the imaging optical system control device estimates the surface of the wafer in an inclined approximation plane on the basis of data of the height observed at least at two points, and
 the camera control device corrects the switching timing of the image detection element such that the height of the surface of the wafer becomes an estimated height of the approximation plane.

7. A wafer inspection method comprising:
 optically observing a surface of a wafer placed on a stage by an optical observation unit;
 converting an optical signal obtained by observing the surface of the wafer into an electric signal by a time delay integration type image detection element;
 detecting a position of the stage by a stage position detector;
 measuring a height of the surface of the wafer by at least one height sensor;
 changing optical magnification of the optical observation unit and focusing on the surface of the wafer on the basis of the height of the surface of the wafer measured by the at least one height sensor by an imaging optical system control device that controls the optical observation unit; and
 correcting a switching timing of the image detection element on the basis of the optical magnification and the position of the stage by a camera control device that controls a TDI camera including the image detection element.

8. The wafer inspection method according to claim 7, wherein the camera control device corrects the switching timing of the image detection element such that a change in optical magnification of the optical observation unit is 1% or smaller.

9. The wafer inspection method according to claim 7, further comprising:
- storing height data of the surface of the wafer in a buffer,
- wherein the camera control device corrects the switching timing of the image detection element by using past height data stored in the buffer as a trajectory along which reciprocating inspection is performed on the wafer to inspect while an observation position is shifted on the surface of the wafer.

10. The wafer inspection method according to claim 7, further comprising:
- observing at least two points of height of the surface of the wafer by at least two height sensors; and
- estimating the surface of the wafer in an inclined approximation plane by using data of the height at the at least two points by the imaging optical system control device,
- wherein the camera control device corrects the switching timing of the image detection element such that the height of the surface of the wafer becomes an estimated height of the approximation plane.

* * * * *